(12) United States Patent
Desrosiers et al.

(10) Patent No.: US 7,297,015 B1
(45) Date of Patent: Nov. 20, 2007

(54) APPARATUS FOR DOCKING A PRINTED CIRCUIT BOARD

(75) Inventors: Norman Bruce Desrosiers, Oxford, NC (US); Dean Frederick Herring, Youngsville, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/687,839

(22) Filed: Mar. 19, 2007

(51) Int. Cl.
*H01R 13/64* (2006.01)

(52) U.S. Cl. ...................... 439/377; 361/755

(58) Field of Classification Search ................ 439/64, 439/260, 310, 377; 361/726, 727, 747, 755, 361/756
See application file for complete search history.

(56) References Cited

U.S. PATENT DOCUMENTS

| | | | |
|---|---|---|---|
| 5,115,376 A | | 5/1992 | Nakajima |
| 5,269,698 A | * | 12/1993 | Singer ........................ 439/157 |
| 5,790,373 A | | 8/1998 | Kim et al. |
| 5,919,055 A | * | 7/1999 | Hattori ........................ 439/310 |
| 6,093,040 A | * | 7/2000 | Kodama et al. ............ 439/157 |
| 6,195,259 B1 | | 2/2001 | Whitman et al. |
| 6,267,609 B1 | * | 7/2001 | Korsunsky et al. ......... 439/160 |
| 6,406,312 B1 | | 6/2002 | Heitkamp |
| 6,411,517 B1 | | 6/2002 | Babin |
| 6,667,890 B1 | | 12/2003 | Barringer et al. |
| 6,930,892 B2 | * | 8/2005 | Barringer et al. ........... 361/801 |

* cited by examiner

*Primary Examiner*—Thanh-Tam Le
(74) *Attorney, Agent, or Firm*—Cynthia S. Byrd; Streets & Steele; Jeffrey L. Streets

(57) ABSTRACT

An apparatus comprising a guide plate selectively securable in a position adjacent a first electronic connector, wherein the guide plate includes a linear slot. A mounting plate is positioned generally parallel to the guide plate, wherein the mounting plate comprises two or more mounting pins, and is vertically slidably secured to the guide plate by the pins extending through the linear slot. Between the guide plate and the mounting plate, a rotatable plate is pivotally coupled, wherein the rotatable plate includes one or more cam slots slidably receiving a mounting pin. An electronic circuit board is coupled to the mounting plate, the electronic circuit board having a second electronic connector selectively mateable with the first electronic connector. The rotatable plate is actuated so that the cam slots cause the mounting plate and circuit board to move vertically to insert and remove the second connector relative to the first connector.

13 Claims, 5 Drawing Sheets

APPARATUS FOR DOCKING A PRINTED CIRCUIT BOARD

BACKGROUND OF THE INVENTION

1. Field of the Invention

The present invention relates to printed circuit board installation in electronic devices. More specifically, the invention provides an apparatus for accurately docking a printed circuit board in a constrained space.

2. Description of the Related Art

Swappable components have become commonplace in computer systems. Computer systems often use swappable memory, hard drives, and various pieces of hardware commonly referred to as daughter cards. Many maintenance, repair, or upgrade operations involve the removal of a piece of hardware, or the insertion of a piece of hardware, or both while the computer is on and functioning.

In a server rack, or chassis, many computer components are stored in close proximity. Often, these racks have numerous electronic circuit boards. The electronic circuit boards may be aligned in banks, both above or below, or beside each other. The electronic circuit boards may provide memory for the system, or perform specific other operations within the computer system.

Conventionally, the changing of an electronic circuit board may be accomplished by removing a cover, removing the prior electronic circuit board by lift it out of a header, and docking a new electronic circuit board by inserting it straight into the header. However, computer components are often installed in configurations making it difficult to achieve the mechanical advantage to accurately and carefully dock an electronic circuit board. If the docking or undocking of an electronic circuit board is needed where space is a concern, it may necessitate the removal of one or more electronic circuit boards from the neighboring slots. This procedure might then require the entire system to be shut down.

It is fairly common for computer systems to be continually operational. Therefore, installation, removal, or replacement of components is preferably accomplished via hot-swapping without disturbing the operation of adjacent circuit boards. This necessarily means that users are manipulating components of an electrically energized system. It would be desirable to have a means of inserting or removing an electronic circuit board without risk of damage to either the user or the component.

Printed circuit boards, such as daughter cards, can become damaged during insertion into a connector or header due to an uneven application of force or misalignment of the daughter card with the connector slot. It is ideal if the card is carefully position above and parallel to the connector, then pressed slowly and firmly straight toward the connector until a successful connection has been made. Haste and inaccessibility are just two of many factors that can prevent the ideal connection from ever occurring.

Therefore, there is a need for a device that facilitates safe, effective and simple insertion and removal of electronic circuit boards, even in very tight spaces. It would be desirable if such a device were durable and reliable in providing good connections.

SUMMARY OF THE INVENTION

The present invention provides an apparatus comprising a guide plate selectively securable in a position adjacent a first electronic connector, wherein the guide plate includes at least one linear slot. A mounting plate is positioned generally parallel to the guide plate, wherein the mounting plate comprises two or more mounting pins, and is vertically slidably secured to the guide plate through the at least one linear slot. Between the guide plate and the mounting plate, a rotatable plate is pivotally coupled, wherein the rotatable plate includes two or more cam slots to slidably receive the mounting pins. An electronic circuit board is fixedly coupled to the mounting plate, the electronic circuit board having a second electronic connector selectively mateable with the first electronic connector. When the rotatable plate is actuated, the cam slots on the rotatable plate cause the mounting plate and circuit board to move vertically over a distance sufficient to insert and remove the second electronic connector relative to the first electronic connector.

The foregoing and other objects, features and advantages of the invention will be apparent from the following more particular description of a preferred embodiment of the invention, as illustrated in accompanying drawings wherein like reference numbers represent like parts of the invention.

DETAILED DESCRIPTION

Figure 1:
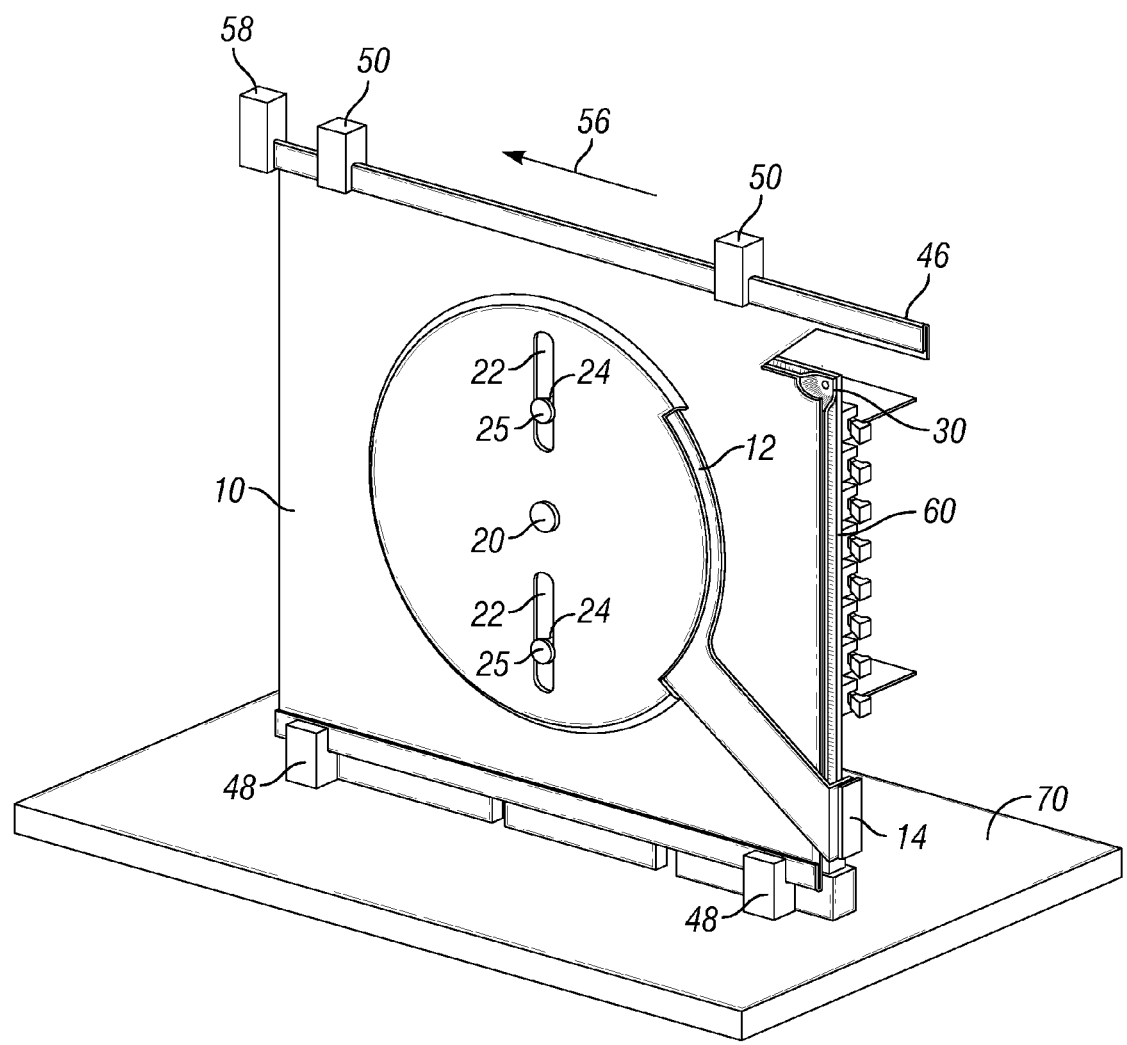
FIG. 1 is a perspective view of an apparatus including a guide plate and a rotary linkage in accordance with one embodiment of the invention.

FIG. 1 is a perspective view of a guide plate 10 and a rotary linkage in accordance with one embodiment of the invention. The guide plate 10 is a rigid structural member that supports and positions other components. The guide plate 10 has a pivot coupling 20 that pivotally secures a rotatable plate 12 to the guide plate and a generally vertical slot 22 to accommodate the vertical movement of a pin 24 secured to a mounting plate 30. The pin 24 preferably terminates in a head (shown in FIG. 2) that prevents the pin 24 from pulling through the slot.

The rotary linkage allows for accurate and repeatable vertical movement of the mounting plate 30 relative to the guide plate 10 for insertion and removal from a connector where user access is constrained. Accordingly, the rotary linkage includes the rotatable plate 12 with a positioning handle 14 extending from one side for user access. The rotatable plate 12 is pivotally coupled to the guide plate 10 at the pivot coupling 20 and the positioning handle 14 may be actuated to rotate the rotatable plate 12.

As shown in FIG. 1, the guide plate 10 has been slidingly inserted (preferably in the direction of arrow 56) in a lower guide or guides 48 secured to a first electronic circuit board 70 and an upper guide or guides 50 secured to a chassis member (not shown). Alternatively, both upper and lower guides may be secured to a chassis member, so long as a second electronic circuit board 60 can be connected to and communicate with a first connector (not shown) positioned immediately adjacent the guide plate. In either instance, the leading edge of the guide plate 10 should engage a stop 58 at the point where the guide plate is properly aligned for inserting the second electronic circuit board 60 directly into the first connector. The stop 58 may be secured to the chassis (not shown) or could be positioned at the lower edge of the guide plate and be formed as part of the first connector (not shown) itself in order to further avoid alignment errors.

Figure 2:
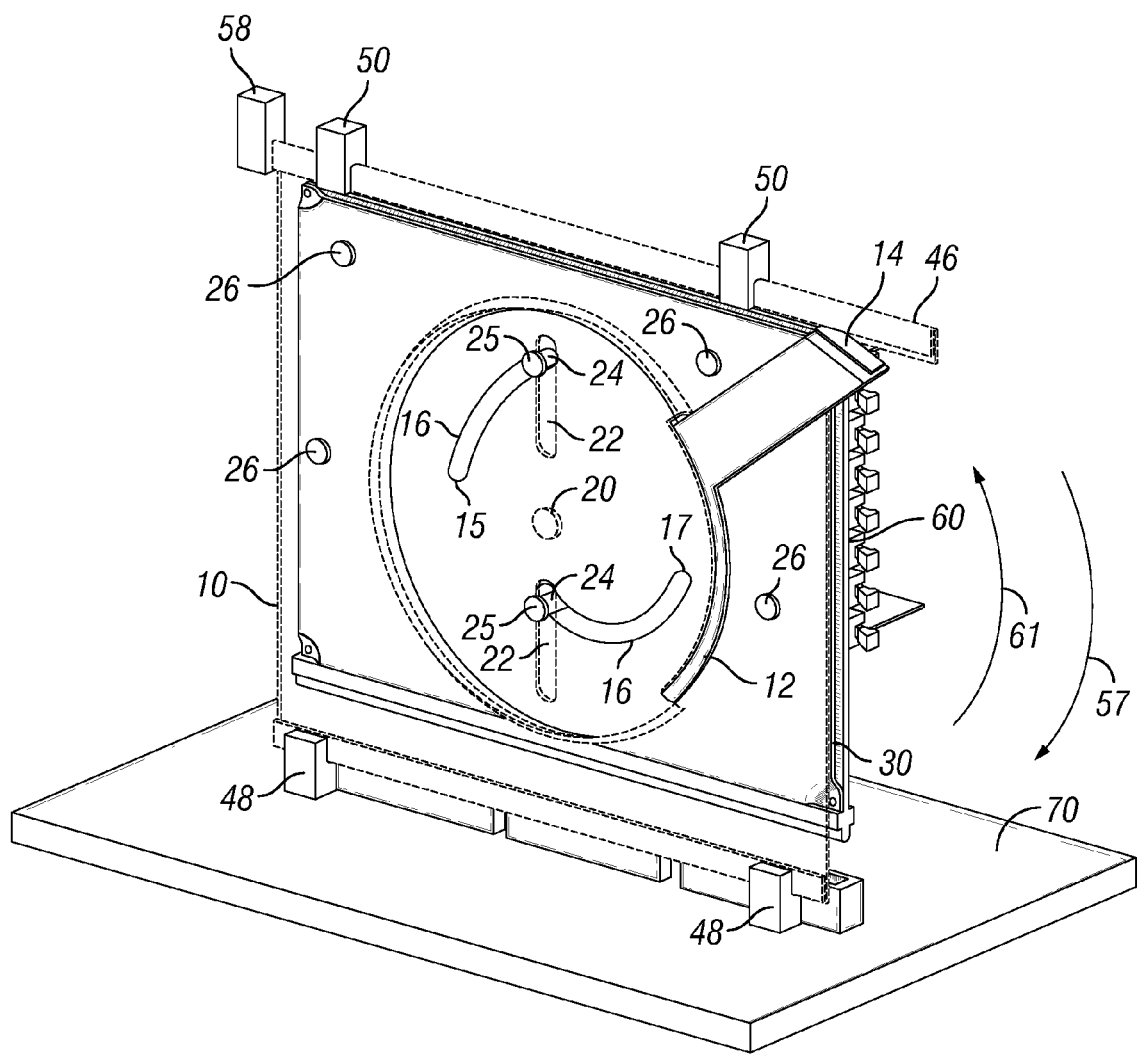
FIG. 2 is a perspective view of the guide plate and the rotary linkage with the guide plate shown as translucent for illustrative purposes.

FIG. 2 is a perspective view of the apparatus with the guide plate 10 shown as translucent in order to better illustrate the operation of the rotary linkage. The rotatable plate 12 comprises a cam slot 16 that receives the pin 24 attached to the mounting plate 30. The cam slot 16 has a first end 15 and a second end 17, wherein the first end 15 is a first distance to the pivot coupling 20 to allow for the lowering of the pin 24 and mounting plate 30 and the second end 17 is a second longer distance to the pivot coupling 20 to allow for the raising of the pin 24 and the mounting plate 30. The rotatable plate 12 is made of a rigid material, such as metal, to maintain its shape during use, especially when actuated in either direction and encountering frictional resistance of the coupling or decoupling connectors.

When more than one cam slot 16 exists on the rotatable plate 12 on opposite sides of the pivot coupling 20, the distance from the pivot coupling 20 to one cam slot is related to the distance from the pivot coupling 20 to the other cam slot. Preferably, along any line intersecting the pivot coupling 20 and passing between the two cam slots in the plane of the rotatable plate 12, the distance between the two cam slots 16 is a constant and should be the same as the distance between the two pins 24 received within the cam slots. If this relationship is not maintained, then the rotary linkage is likely to bind up.

The rotatable plate 12 supports a mounting plate 30. While the mounting plate 30 is receiving vertical support from the cam slot 16 via the pins 24 attached to the mounting plate 30, the movement of the mounting plate 30 is also laterally constrained by the pair of pins 24 that extend from the mounting plate 30 through a pair of vertical slots 22 in the guide plate 10. While one slot and pin might be sufficient, the use of two or more parallel, vertical slots 22 and pins 24 is highly preferable. The slots 22 in the guide plate should run in a direction that a second electronic circuit board 60 should be moved for installation into a first connector (not shown). The pins 24 preferably have a head 25 to prevent the pins from pulling out of the slots 22, as the pins 22 provide the only coupling of the mounting plate 30 to the guide plate 10.

The positioning handle 14, has been actuated upward along an arcuate path about pivot coupling 20, toward the top of the guide plate 10 (in the direction of arrow 61) causing the mounting plate 30 to be displaced upward (along the slot 22). The rotation of the cam slots 16 have caused an upward displacement of the pins 24 attached to the mounting plate 30. The displacement is accomplished by the action of the cam slots 16 increasing the distance from the pivotal coupling 20 to the upper pin 24 and decreasing the distance from the pivotal coupling 20 to the lower pin 24. In this embodiment, when the positioning handle 14 is raised, the distal end 17 of the upper cam slot 16 is vertically aligned with the pivotal coupling 20 and the proximal end 15 of the lower cam slot 16 is vertically aligned with the pivotal coupling 20. It should be noted that it is not necessary to utilize the entirety of either cam slot 16 in order to accomplish the motion of the mounting plate 30. It should also be noted that the cam slots 16 can easily be designed to create a displacement of the pins 24 opposite to the direction of displacement of the positioning handle 14. For example, raising the handle could be made to lower the mounting plate 30 by reversing the orientation of the cam slots 16.

It should be recognized that movement of the positioning handle 14 in the direction of arrow 61 will cause the mounting plate to move to an "up" position and movement of the positioning handle 14 in the direction of arrow 57 will cause the mounting plate to move to a "down" position. Furthermore, this up and down movement occurs without any lateral movement of the guide plate or the mounting plate. In this manner, a second electronic circuit board mounted to the mounting plate may be carefully and accurately vertically downwardly inserted into and vertically upwardly removed from a connector (not shown) on a first electronic circuit board 70 by actuation of the positioning handle 14.

One or more sliders 26 are optionally secured between the mounting plate and the guide plate to serve as low friction spacers that stabilize the motion of the mounting plate in a plane generally parallel to the plane of the guide plate. Any number of sliders may be secured to the mounting plate, the guide plate, or both. The sliders 26 may comprise a protrusion on the mounting plate or guide plate to contact the guide plate or mounting plate, respectively. The slider may be a small tab of plastic, or any other material that can maintain the uniform standoff between the guide plate and the mounting plate, without restricting or interfering with the motion of the mounting plate.

Figure 3A:
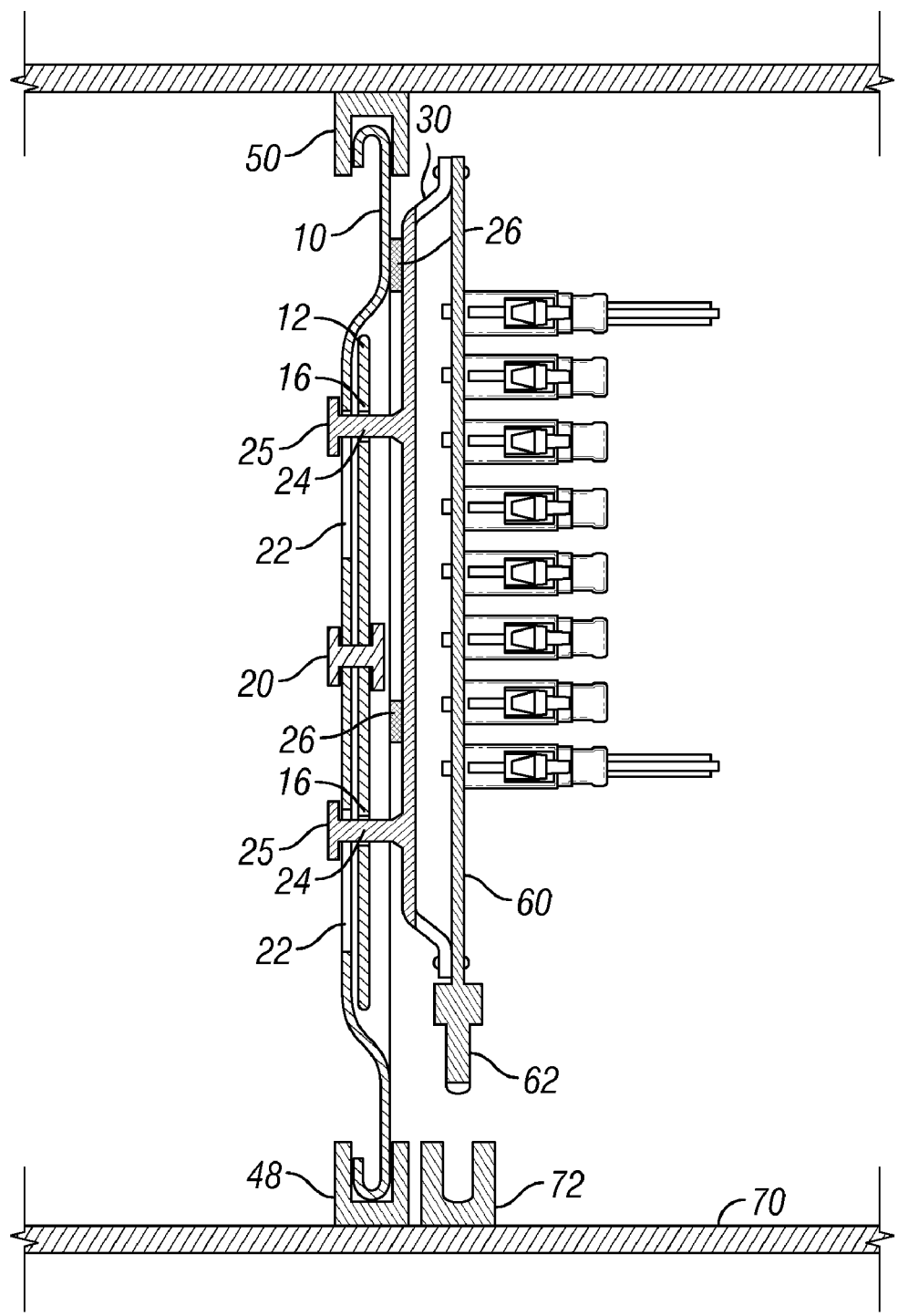
FIGS. 3A-3C are a series of cross-sectional views showing the operation of the apparatus to insert a second connector into a first connector.
Figure 3B:
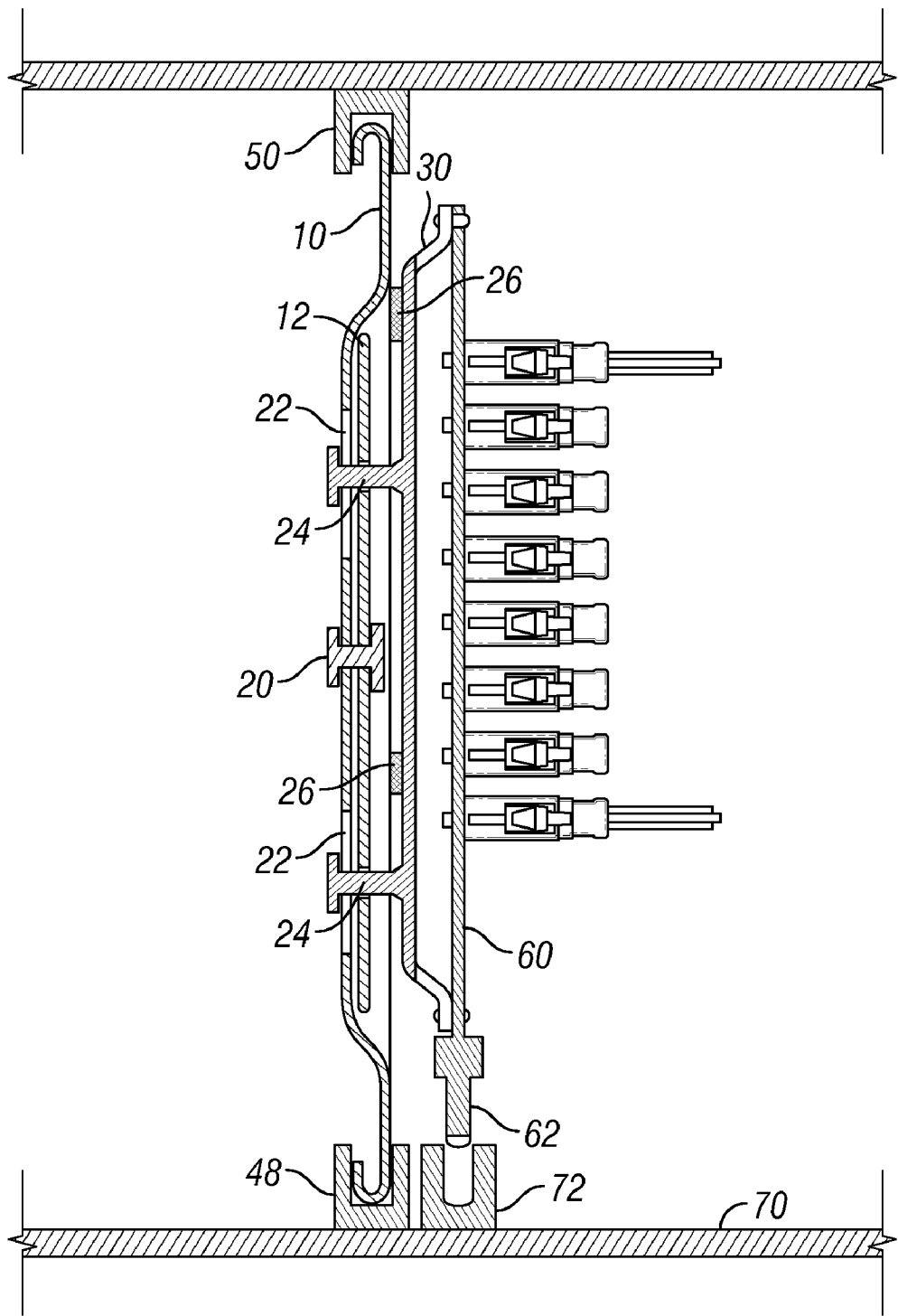
Figure 3C:
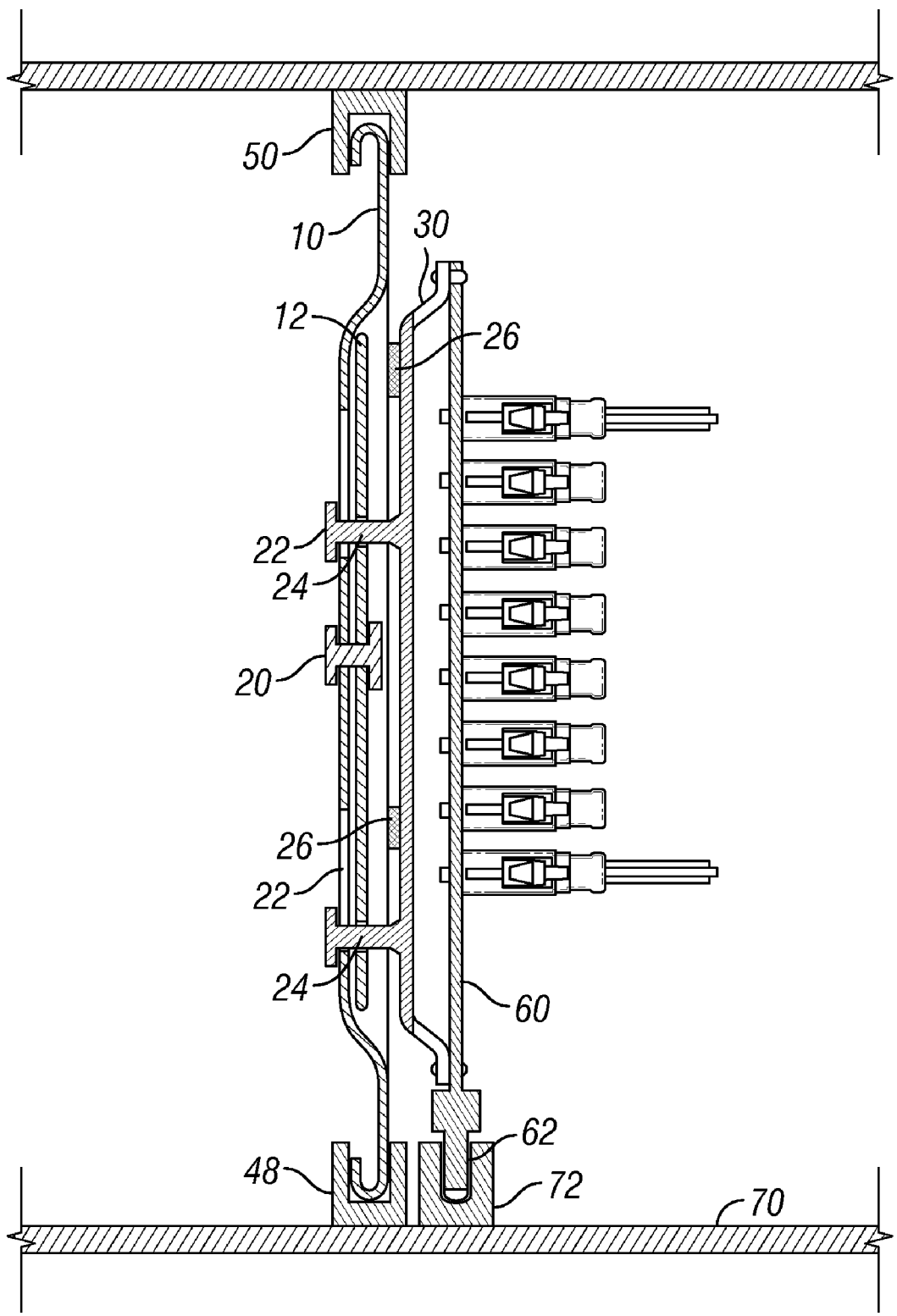

Still further, the guide plate 10 may also include a handle 46 to facilitate handling of the entire assembly without touching the second electronic circuit board 60. The handle 46 may optionally be made of or protected by a non-conducting material, such as rubber, to protect the user from accidental electrical shock. FIGS. 3A-3C are a series of cross-sectional views along the line A-A in FIG. 2.

In FIG. 3A, the guide plate 10 is shown fully inserted into a chassis (not shown) as described in FIG. 1. A first electronic circuit board 70 with a first connector 72 resides beneath the apparatus comprising the guide plate 10, the rotatable plate 12, and the mounting plate 30. In this embodiment, the positioning handle (not shown) is in the "up" position, to position the mounting plate 30 in the up position in a manner consistent with FIG. 2.

The guide plate 10 has been inserted into an upper and lower guide 50, 48 respectively. A stop (not shown) has positioned the guide plate 10 to align the first connector 72 with a second connector 62, as discussed in FIG. 1. Further, the rotatable plate 12 is coupled at the pivot coupling 20 to the guide plate 10.

The mounting plate 30 comprises two pins 24 that pass through the cam slots 16 in the rotatable plate 12, and the slots 22 in the guide plate 10. The pins 24 may terminate in a head 25, which prevents them from being pulled out of slots 22 in the guide plate 10. The mounting plate is being vertically supported by the cam slots 16, while being horizontally constrained by slots 22 in the guide plate 10. Optionally the mounting plate 30 may comprise one or more sliders 26, to maintain a parallel orientation between the mounting plate 30 and the guide plate 10, as well as maintain an offset for the mounting plate 30 which helps align the first and second connectors 72, 62. As discussed in FIG. 2, the optional sliders 26 may be on the mounting plate 30, or the guide plate 10. In this embodiment, the sliders 26 are shown attached to the mounting plate 30.

A second electronic circuit board 60 with the second connector 62 is secured to the mounting plate 30. The second electronic circuit board 60 may be secured with screws, clips, or any manner which ensures that the second electronic circuit board 60 is firmly secured, and will move in conjunction with the mounting plate 30. Typically, the second electronic circuit board 62 is a daughter card, or some component which may be frequently inserted or removed from an operating computer system.

FIG. 3B shows the mounting plate 30 being displaced downward in the direction of arrow 74 as the positioning handle (not shown) is being actuated (partially lowered). The second connector 62 is shown about to be received in the first connector 72. Actuating the positioning handle rotates the rotatable plate 12 as discussed in FIG. 2. The pins 24 on the mounting plate 30 have been horizontally constrained by the slots 22 in the guide plate 10, and the cam slots 16 in the rotatable plate are providing a vertical force to displace the mounting plate 30, and therefore the second electronic circuit board 60.

FIG. 3C shows the mounting plate 30 and second electronic circuit board 60 in the "down" position consistent with FIG. 1, such that the second connector 62 has been properly received in the first connector 72. In this figure, the positioning handle (not shown) has been fully actuated (downward), resulting in the complete connection of the second connector 62 into the first connector 72. Removal of the second connector 62 can be accomplished by reversing the process.

Accordingly, the present invention further comprises a method of safely docking or undocking a first electronic circuit board with a first connector with a second electronic circuit board with a second connector to receive the first connector. Initially the first electronic circuit board, comprising a first connector is secured to a mounting plate linked to a guide plate. The first electronic circuit board may be screwed on, clipped on, or secured in any manner that ensures it will move in unison with the mounting plate. The first electronic circuit board may be removably secured, or permanently secured.

The guide plate is inserted into a chassis comprising guides. The guides may receive the guide plate on a rail, in a groove, in a bay, or any other means which allows the chassis to receive the guide plate. The first connector is aligned with a second connector on a second electronic circuit board within the chassis. This may be accomplished by the guides restricting the motion of the guide plate when inserted, manually, with a sensor, or any other method which indicates that the first connector and second connector are aligned.

A force generally perpendicular to the direction of insertion of the guide plate into the chassis is applied. This force may be applied by a user with a handle, a motor, or any means which causes a force to be applied. The force is translated in a direction generally parallel to the direction of application. This translation may be accomplished by rotating an arcuately slotted plate to displace pins attached to the mounting plate, and slots on the guide plate to constrain the motion of the guide plate or mounting plate.

The translated force is applied to the mounting plate. The mounting plate is displaced in a direction generally perpendicular to the direction of insertion of the guide plate into the chassis. The first electronic circuit board secured to the mounting plate moves in unison with the mounting plate. The first connector is then received into the second connector or, alternatively, removed from the second connector.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus comprising:
   a guide plate selectively securable in a position adjacent a first electronic connector, the guide plate including at least one linear slot;
   a mounting plate positioned generally parallel to the guide plate, wherein the mounting plate has two or more spaced apart mounting pins slidably secured through the at least one linear slot of the guide plate;
   a rotatable plate pivotally coupled to the guide plate, wherein the rotatable plate includes two or more opposing cam slots slidably receiving the mounting pins; and
   an electronic circuit board fixedly coupled to the mounting plate, the electronic circuit board having a second electronic connector selectively mateable with the first electronic connector, wherein rotation of the rotatable plate causes the mounting plate and circuit board to move vertically over a distance sufficient to insert and remove the second electronic connector relative to the first electronic connector;
   wherein the guide plate is slidably insertable in upper and lower guide channels secured in a position to transversely align the first and second connectors.

2. The apparatus of claim 1, wherein the rotatable plate includes a handle extending to an edge of the guide plate for user access.

3. The apparatus of claim 1, wherein the guide plate includes a carrying handle.

4. The apparatus of claim 1, wherein the cam slots have an upper edge arranged to bias the mounting pins downward during rotation of the rotatable plate in a first rotational direction and a lower edge arranged to bias the mounting pins upward during rotation of the rotatable plate in a second rotational direction.

5. The apparatus of claim 1, further comprising:
   one or more stabilizing sliders disposed between the mounting plate and guide plate.

6. The apparatus of claim 1, wherein the one or more pins include a head to prevent accidental removal from the slots.

7. The apparatus of claim 1, further comprising:
   a stop member to limit the insertion of the guide plate and axially align the first and second connectors.

8. The apparatus of claim 7, wherein the rotatable plate vertically positions the first connector relative to the second connector after the first and second connectors are already axially and transversely aligned.

9. The apparatus of claim 1, wherein the rotatable plate is pivotally coupled to the guide plate by a rivet.

10. The apparatus of claim 1, wherein the at least one linear slot is a vertical slot.

11. The apparatus of claim 1, wherein the upper and lower guide channels are generally horizontal.

12. The apparatus of claim 11, wherein the at least one linear slot is a generally perpendicular to the guide channels.

13. The apparatus of claim 1, wherein the mounting plate has offset mounting brackets for securing the electronic circuit board in a generally parallel spaced apart relationship.

* * * * *